United States Patent [19]

Davies et al.

[11] 4,433,302

[45] Feb. 21, 1984

[54] AMPLIFIER WITH INDEPENDENT QUIESCENT OUTPUT VOLTAGE CONTROL

[75] Inventors: Robert B. Davies; Ira Miller, both of Tempe, Ariz.

[73] Assignee: Motorola, Inc., Schaumburg, Ill.

[21] Appl. No.: 352,903

[22] Filed: Feb. 26, 1982

[51] Int. Cl.³ .............................................. H03F 3/45
[52] U.S. Cl. .................... 330/257; 330/256; 330/288; 330/289
[58] Field of Search ..................... 330/256, 257, 288; 323/315, 316

[56] References Cited

U.S. PATENT DOCUMENTS 3,649,926 3/1972 Hill ...................................... 330/257

Primary Examiner—James B. Mullins
Assistant Examiner—Steven J. Mottola
Attorney, Agent, or Firm—William E. Koch

[57] ABSTRACT

A circuit for providing a quiescent output voltage having a load resistor, a current means for establishing a load current through the load resistor, and a mirror means for summing a mirror current with the load current at an output terminal. The current means comprises a differential amplifier driving a multiplying mirror. The mirror means comprises a Wilson mirror for providing one of its tail currents as the additional current to be summed at the output terminal. The circuit provides a quiescent output voltage that is independent of the reference voltage supplying the differential amplifier or the tail current through the differential amplifier.

5 Claims, 1 Drawing Figure

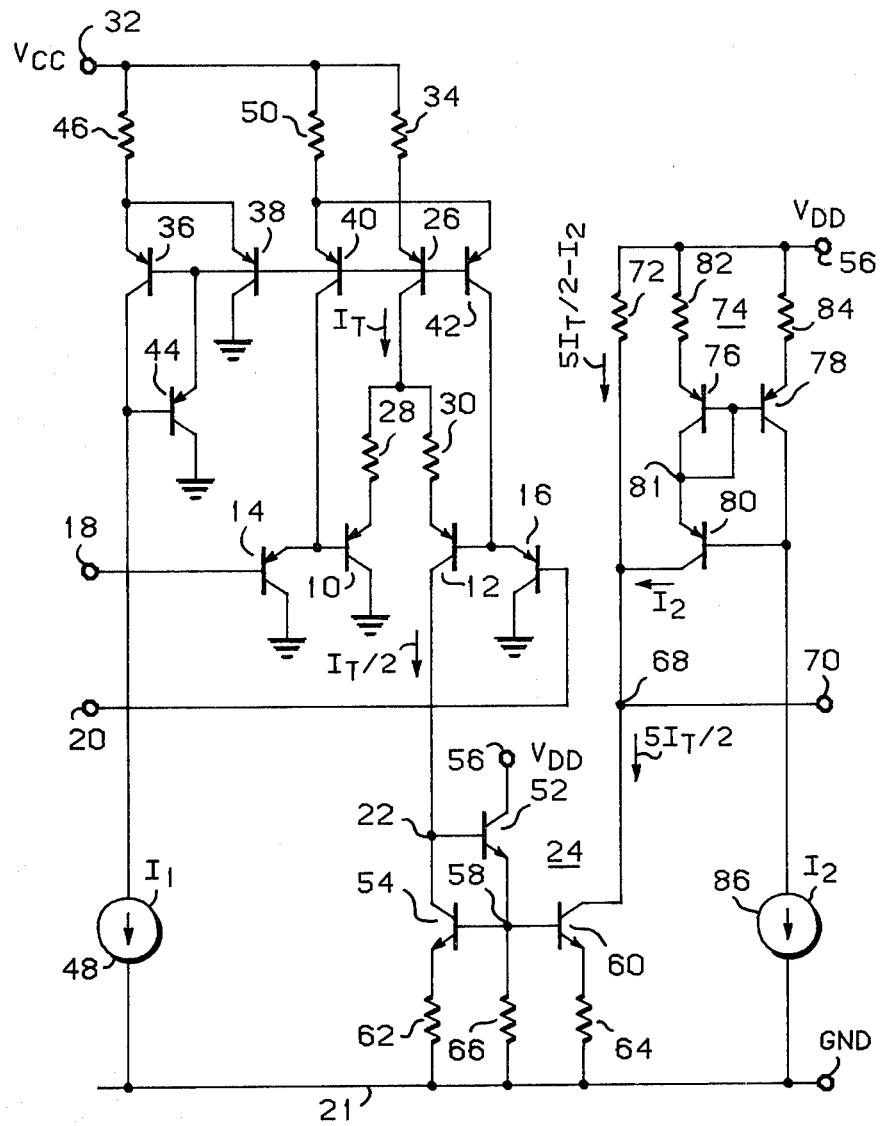

AMPLIFIER WITH INDEPENDENT QUIESCENT OUTPUT VOLTAGE CONTROL

BACKGROUND OF THE INVENTION

1. Field of the Invention

This invention relates, in general, to a constant voltage amplifier, and more particularly to an amplifier that establishes a desired quiescent output voltage independent of the gain or changes in temperature.

2. Background Art

Constant voltage circuits typically have a load resistor supplying an output voltage which is dependent on a reference voltage supplying the load resistor, and the current permitted to pass through the load resistor by the amplifier.

One known circuit is described in U.S. Pat. No. 4,122,403 wherein a transistor controls current to a load resistor. The resistor and a current source are coupled in parallel between a reference voltage and the collector of the transistor. The additional current to the transistor from the current source decreases the internal base-emitter resistance of the transistor.

Another known circuit includes a balanced differential amplifier transistor pair whose tail current drives a mirror. The mirror reflects the current to the load resistor. The gain of the amplifier is dependent, in part, on the resistance of the base-emitter of the transistor of the differential pair supplying the tail current. In order to reduce the temperature dependence of the amplifier, the tail current must be increased to minimize the emitter-base resistance effect. However, since the reference voltage must have a certain value to give the desired output voltage, a large tail current would saturate the mirror transistor reflecting the current to the load resistor. This saturation prevents any information from being transmitted at the output.

Thus, what is needed is an amplifier for providing a quiescent output voltage independent of gain and the supply voltage, and whose gain fluctuation due to temperature change is minimized.

SUMMARY OF THE INVENTION

Accordingly, it is an object of the present invention to provide an improved non-feedback, fixed gain voltage amplifier with independent quiescent output voltage control.

Another object of this invention is to provide an amplifier that has a quiescent output voltage independent of gain of the amplifier.

A further object of this invention is to provide an amplifier whose gain fluctuations due to temperature change are minimized.

In carrying out the above and other objects of the invention in one form, there is provided an improved non-feedback, fixed gain voltage amplifier with independent quiescent output voltage control having an input and an output, the input having rising and falling transitions, for providing a quiescent output voltage when the input is in one of the transitions, comprising an output means, a current means coupled to the input and the output means for controlling a load current through the output means, and a mirror means coupled to the output means and the current means for providing a mirror current that is summed with the load current at the output.

The above and other objects, features, and advantages of the present invention will be better understood from the following detailed description taken in conjunction with the accompanying drawing.

BRIEF DESCRIPTION OF THE DRAWING

The single FIGURE is a schematic of the preferred embodiment of the invention.

DETAILED DESCRIPTION OF THE INVENTION

The voltage gain of a differential amplifier having PNP transistors can be approximated by the following equation:

$$A_V = R_X/(R_E + r_e)$$

where $A_V$ equals the voltage gain of the amplifier, $R_X$ equals the load resistance in parallel with the internal collector resistance of the transistors, $R_E$ is the resistance of an external resistor in series with the emitter of the transistors, and $r_e$ is the transistor's internal AC emitter resistance. The internal resistance of the transistor's collector is usually assumed to be so much larger than the load resistor that $R_X$ is considered to be equal to the load resistor. The internal resistance of the transistor's emitter can be represented by the following equation:

$$r_e = kT/qI_E$$

where k equals Boltzmann's constant, T is temperature, q is the charge of an electron, and $I_E$ is the emitter current of the transistor. It will be noted that the internal resistance of the emitter is directly proportional to temperature and therefore will vary as temperature varies. Since Boltzmann's constant is a fixed value and the charge of an electron is fixed, the only parameter left that may be varied to reduce the effect of temperature change is the emitter current. As can be seen from the above equation, as the emitter current is increased the internal emitter resistance decreases. If the internal emitter resistance becomes small enough it will then have a minimum effect on the gain of the amplifier.

Referring now to the single FIGURE, the circuit in accordance with the present invention includes a Darlington differential amplifier comprising PNP transistors 10 and 12. The bases of transistors 10 and 12 are connected to the emitters of PNP transistors 14 and 16 respectively. Transistors 14 and 16 have their bases connected to inverting input terminal 18 and noninverting input terminal 20, respectively, and serve to drive the differential amplifier transistors 10 and 12. The collectors of transistors 10, 14 and 16 are all connected to ground rail 21, and the collector of transistor 12 is connected to node 22 for driving a multiplying mirror 24. The emitters of transistors 10 and 12 are coupled to the collector of PNP transistor 26 by degeneration resistors 28 and 30, respectively. Transistor 26 supplies the current, $I_T$, from its collector to the differential amplifier transistors 10 and 12. The emitter of transistor 26 is coupled to the $V_{CC}$ rail 32 by resistor 34. The base of transistor 26 is connected to the bases of PNP transistors 36, 38, 40, 42 and the emitter of PNP transistor 44.

Transistor 36, by having its base coupled to its collector by transistor 44, serves as a diode and has its emitter both connected to the emitter of transistor 38 and coupled to $V_{CC}$ rail 32 by resistor 46. The collector of transistor 36 is connected to the base of transistor 44 and is coupled to ground rail 21 by current source 48. Transistors 36, 38, 40, 26 and 42 are thereby biased by the diode action of transistors 36 and 44 and the pulling action of current source 48. The collector of transistor 44 is connected to ground rail 21 and serves as a beta eliminator, compensating for the base currents of transistors 26, 36, 38, 40 and 42. Transistor 44 reduces the base currents from transistor 36, 38, 40, 26 and 42 that would flow to current source 48 if the base of transistor 36 were connected directly to current source 48, thereby ensuring current $I_1$ comprises predominantly the current from the collector of transistor 36. The collectors of transistors 40 and 42 are connected to the emitters of transistors 14 and 16, respectively, for biasing the differential amplifier driver transistors 14 and 16. The emitters of transistors 40 and 42 are coupled to $V_{CC}$ rail 32 by resistor 50.

Multiplying mirror 24 is driven by substantially $\frac{1}{2}I_T$ supplied at node 22 from the collector of transistor 12. The base of NPN transistor 52 and the collector of NPN transistor 54 are connected to node 22. The collector and emitter of beta eliminator transistor 52 are connected to $V_{DD}$ rail 56 and node 58, respectively, thereby supplying current to the bases of transistors 54 and 60. The emitters of transistors 54 and 60 are coupled to ground rail 21 by resistors 62 and 64, respectively. Node 58 is coupled to ground rail 21 by resistor 66. The collector of transistor 60 is connected to node 68 which is connected to output terminal 70.

Node 68 is coupled to $V_{DD}$ rail 56 by both load resistor 72 and Wilson mirror 74. Mirror 74 includes PNP transistors 76, 78 and 80. The emitters of transistors 76 and 78 are coupled to $V_{DD}$ rail 56 by resistors 82 and 84, respectively. Node 81 is coupled to the bases of transistors 76 and 78, the collector of transistor 76, and the emitter of transistor 80. The base of transistor 80 and the collector of transistor 78 are coupled to ground rail 21 by current source 86. The collector of transistor 80 is connected to node 68.

In operation, transistor 26 supplies current $I_T$ to the differential amplifier transistor pair 10 and 12. If transistors 10 and 12 are balanced, transistor 12 supplies $I_T/2$ to the multiplying mirror 24. The area of transistor 60 is larger than the area of transistor 54, i.e., 5 times, thereby multiplying the current from node 68 to ground rail 21 giving $5I_T/2$. The Wilson mirror 74 supplies a current of $I_2$ to node 68. The current through load resistor 72 is therefore $5I_T/2 - I_2$. By summing the current $I_2$ from Wilson mirror 74 at node 68, the current to resistor 72 is reduced. Furthermore, by having $I_1$ and $I_2$ determined by a zero temperature coefficient reference voltage and a resistor within current sources 48 and 86, the resistor having substantially an identical temperature coefficient as resistors 72, 28, and 30, the value of the quiescent voltage output at terminal 70 may be set with zero temperature coefficient as $I_2$ varies with $I_1$. In other words, as $I_2$ varies, the current ($5I_T2$) to the collector of transistor 60 varies proportionally. This current $5I_T/2$ varies with $I_1$ which eliminates the dependence of the output voltage on gain. Therefore, $I_T$ can be increased to lower the effect of the base-emitter resistance of transistor 12, thereby reducing the amplifier response to a change in temperature. Since $I_2$ is added at node 68 through Wilson mirror 74 which has an output impedance in the hundreds of megohms, its effect on gain is negligible. $I_2$ therefore negates the dependence of the base-emitter resistance of transistor 80 verses the desired value of voltage output at terminal 70 without restricting the gain.

By now it should be appreciated that there has been provided an amplifier that establishes a desired quiescent output voltage independent of the gain or changes in temperature by summing the current from a high output impedance mirror with the load current at the output and thereby allowing for the increase of current supplied to a differential pair that determines the load current. The increased current across the base-emitter junctions of the differential pair reduces the effect of temperature changes on the differential pair. The amplifier just described is useful when a quiescent output signal is required to reflect a single voltage input signal, for example, the amplifier described could amplify the small signal received from a magneto-resistive detector element of a bubble memory device.

Although the invention has been illustrated as having certain types of transistors, it will be understood that other types of transistors or semiconductor devices can be substituted to achieve the advantage of the present invention.

We claim:

1. An amplifier having an input terminal responsive to an input having rising and falling transitions, and an output terminal for providing a quiescent output voltage when said input is in one of said transitions, said circuit comprising:
    current means coupled to said input terminal and responsive to said input for establishing a predetermined current at a node;
    load means coupled to said current means through said node and having a load current; and
    mirror means coupled to both said load means and said current means at said node and having a mirror current, said predetermined current being substantially similar to the summation of said load current and said mirror current, said node coupled to said output terminal.

2. The amplifier according to claim 1 wherein said load means comprises a resistor.

3. The amplifier according to claim 1 wherein said current means comprises:
    a differential amplifier coupled to said input terminal and responsive to said input, comprising a differential transistor pair having a first and second resistors coupled to a current carrying electrode thereof, respectively, and providing a pair of differential currents, one of said differential currents determining said predetermined current; and
    a second current source including a third resistor, coupled to said differential transistor pair for determining a current supplied to said differential transistor pair.

4. The amplifier according to claim 3 wherein said differential amplifier is responsive to an input having an inverting signal and a non-inverting signal.

5. The amplifier according to claim 1 wherein said mirror means comprises a second current source including a fourth resistor, for establishing said mirror current, wherein the temperature coefficient of said first, second, third, and fourth resistors are substantially similar.

* * * * *